United States Patent [19]

Jackson

[11] 4,228,543
[45] Oct. 14, 1980

[54] PROGRAMMABLE TELEVISION RECEIVER CONTROLLERS

[76] Inventor: Joseph N. Jackson, 716 S. Harvard, Apt. 126, Los Angeles, Calif. 90005

[21] Appl. No.: 889,729

[22] Filed: Mar. 24, 1978

Related U.S. Application Data

[63] Continuation-in-part of Ser. No. 764,032, Jan. 21, 1977, Pat. No. 4,081,754.

[51] Int. Cl.² .................. H04B 1/16; H01H 43/00
[52] U.S. Cl. ......................... 455/181; 340/309.1; 358/191.1; 455/186; 455/190
[58] Field of Search ............. 325/395, 396, 464, 468, 325/461, 470, 492, 391–393; 340/309.1, 309.4, 309.5; 358/191; 361/92

[56] References Cited

U.S. PATENT DOCUMENTS

| 3,555,430 | 1/1971  | Fischer et al. ........... 325/461 |
| 3,696,302 | 10/1972 | Gossard .................. 325/461 |
| 3,778,721 | 12/1973 | Moran .................... 325/396 |
| 3,800,230 | 3/1974  | Marks et al. ............ 325/396 |
| 3,801,915 | 4/1974  | Ostuni et al. ........... 325/461 |
| 3,936,752 | 2/1976  | Sasabe et al. ........... 325/396 |
| 4,031,470 | 6/1977  | Kokado et al. .......... 325/396 |
| 4,081,753 | 3/1978  | Miller ................... 358/191 |
| 4,086,643 | 4/1978  | Jacobs ................... 361/92 |
| 4,088,958 | 5/1978  | Suzuki et al. ........... 325/396 |
| 4,114,104 | 9/1978  | Denzene ................. 325/470 |

Primary Examiner—Marc E. Bookbinder
Attorney, Agent, or Firm—Blakely, Sokoloff, Taylor & Zafman

[57] ABSTRACT

Programmable television receiver controllers which may be manually programmed by a user to select or to limit the viewing selections for random times, typically in one-half hour intervals, throughout a predetermined time period such as a one week time period. Program selections may be made by setting suitable controls for the day, AM or PM, the half hour of the day and the channel desired, and entered into a memory by a pushbutton control. Thereafter a digital control clock automatically selects the pre-entered information at the appropriate times and provides a control signal which may be used to automatically select the identified channels to the exclusion of all others. Alternatively, the signal may be used to exclude the selected channel from selection manually. In one embodiment, the programmable controller is incorporated in the original design of the television receiver and in a second embodiment, an external controller is disclosed which can be attached to the antenna terminals of a conventional television. Additional embodiments include means for controlling other functions such as the ON-OFF function of the receiver.

18 Claims, 8 Drawing Figures

PROGRAMMABLE TELEVISION RECEIVER CONTROLLERS

CROSS REFERENCE TO RELATED APPLICATIONS:

This application is a continuation-in-part of my co-pending application entitled "PROGRAMMABLE TELEVISION RECEIVER CONTROLLERS," filed on Jan. 21, 1977, as Ser. No. 764,032 now U.S. Pat. No. 4,081,754.

BACKGROUND OF THE INVENTION

1. Field of the Invention

The present invention relates to the field of automatic controllers, and more particularly, to programmable controllers for use with television receivers and like equipment.

2. Prior Art

Many systems have been proposed for the automatic control of television receivers, that is, automatic channel selection for particular times of the day based upon programming information entered into the controller at some previous time. Most of these systems, however, are in substantial part mechanical systems which are not particularly easy to program, thereby being relatively expensive to manufacture and difficult to use. Accordingly, such systems have not enjoyed significant commercial use on conventional receivers.

Simple programmable television receiver controllers would provide a number of advantages over conventional channel selectors, and even over remote controlled channel selectors for a number of reasons. There may be programs of particular merit or interest which a viewer does not want to miss. However, the viewer's attention may inadvertently be drawn to another channel at the time, thereby failing to change channels to the more desirable program at the appropriate time. Also at the present time, a number of programs and movies being shown on T.V. are directed toward an adult audience, which programs may be undesirable or outright unsuitable for viewing by children, a situation which may only be expected to increase in the future. In addition, more andmore homes have at least one television receiver controllable at least a substantial amount of the time by children, whereby with conventional channel selectors the "viewers discretion" cannot be exercised by a parent. Accordingly, aprogrammable controller could be programmed periodically, such as once a week, so that those programs of highest merit or viewer interest, will be automatically selected and/or predetermined unobjectionable programs will be selected at times when objectionable programming is being televised on other channels. As an alternative, of course, objectionable programming itself could be programmed for the purposes of locking out such programs from the viewer's selections, e.g., eliminating such programming from the channel selections accessible from the manual channel selector.

U.S. Pat. Nos. 3,215,798 and 3,388,308 disclose automatic television programming systems of the mechanical or electromechanical type, whereby a rotary device mechanically tied to a time clock is programmed to provide some physical movement indicative of the channel to be selected at that time. Devices of the same general type involving some form of motor driven switching unit are also disclosed in U.S. Pat. Nos. 2,755,424, 3,496,438, and 3,569,839. In all of these patents the mechanical complexity of the system disclosed is believed to preclude the widespread adoption thereof on receivers intended for consumer use. Further, most of these systems are operative on a number of switching signals equal to the number of selections desired, though some coding to somewhat reduce the complexity of such systems is known, such as that in U.S. Pat. No. 3,496,438. Also, obviously timing mechanisms or the electromechanical type for various other applications are also known, that disclosed in U.S. Pat. No. 3,603,961 being but one example of such devices.

BRIEF SUMMARY OF THE INVENTION

Programmable television receiver controllers which may be manually programmed by a user to select or to limit the viewing selections for random times, typically in one-half hour intervals, throughout a predetermined time period such as a one week time period. Program selections may be made by setting suitable controls for the day, A.M. or P.M., the half hour of the day and the channel desired, and entered into a memory by a push-button control. Thereafter a digital control clock automatically selects the pre-entered information at the appropriate times and provides a control signal which may be used to automatically select the identified channels to the exclusion of all others. Alternatively, the signal may be used to exclude the selected channel from selection manually. In one embodiment, the programmable controller is incorporated in the original design of the television receiver and in a second embodiment an external controller is disclosed which may be attached to the antenna terminals of a conventional television. Additional embodiments include means for controlling other functions such as the ON-OFF function of the receiver.

DETAILED DESCRIPTION OF THE INVENTION

The present invention comprises programmable television receiver controllers which may select, or alternatively prevent the selection of, specific television programs based upon previously entered program instructions. As shall subsequently be described in detail, the systems are particularly simple to fabricate and easy to program. The first embodiment may be readily incorporated into the design of conventional receivers, particularly the receivers using the newer tuners having some form of numerical or push-button control. The second embodiment may be interfaced with a conventional television receiver simply by attaching the invention to the receiver's antenna terminals.

For purposes of explanation of the invention, a first embodiment thereof will be described in detail, it being understood that variations thereof, etc., some of which will be also described, will become obvious given the fundamental concepts of the embodiment. This first embodiment comprises a programmable television receiver controller for automatically determining (e.g., controlling the channel selector of the receiver as an over-ride to the manual selector) the channel selection for those viewing time periods for which it has been programmed. The purpose of such programming is to automatically present the desired preselected programs to the exclusion of those inadvertently selected at the time, and in the case of children, to prevent the viewing of objectionable programs by predetermining what may be viewed during the times one or more objectionable programs are being televised.

In the first embodiment, T.V. program selections covering time intervals of up to a week are entered into a memory, and then automatically selected by means of a digital control clock when the T.V. receiver is operating. Control of the ON-OFF function is not automated, though certainly it may be incorporated if desired. The program is selected by setting suitable controls for the day, A.M. or P.M., the hour and half-hour of the day, and channel desired, with the selections being entered into memory by a push-button control. The selected channels are thus stored as input information using the particular half-hour time period as the address input for the memory, and are subsequently automatically selected by use of the digital output of the control clock as a memory address. Specific details of the design function and operation of the first embodiment are more fully described below, with specific reference to the drawing illustrating the invention.

Figure 1:
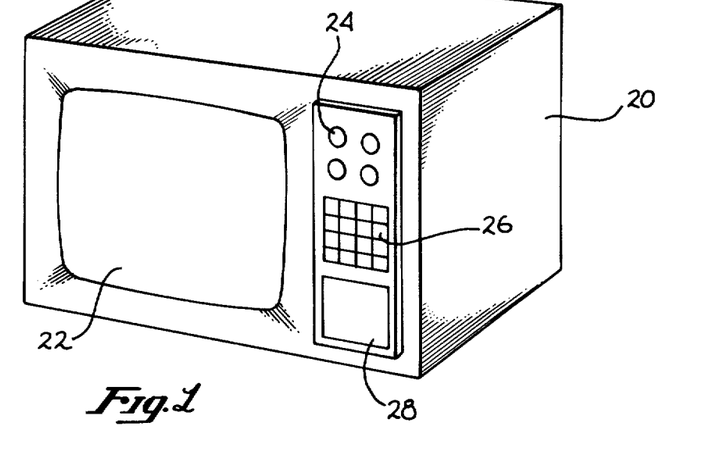
FIG. 1 is a perspective view of a typical receiver incorporating the first embodiment of the present invention.

Now referring to FIG. 1, a perspective view of a television receiver of television set incorporating the first embodiment of the present invention may be seen. It is to be understood that this figure is not intended to represent any specific manufacturer's current receiver, but instead is presented as a schematic representation of the general type of receiver now being offered by a number of manufacturers. In particular, in addition to a generally rectangular enclosure 20 having a picture tube 22 visible from the front thereof, such receivers are characterized by some form of control panel which may include a first group of control switches and other adjustments 24, such as ON-OFF, volume, and picture controls and adjustments, and a keyboard matrix 26 for the push-button channel selection. In addition, the receiver shown in FIG. 1 also contains a small control panel 28 containing the controls for the programming, etc., in accordance with the present invention.

Figure 2:
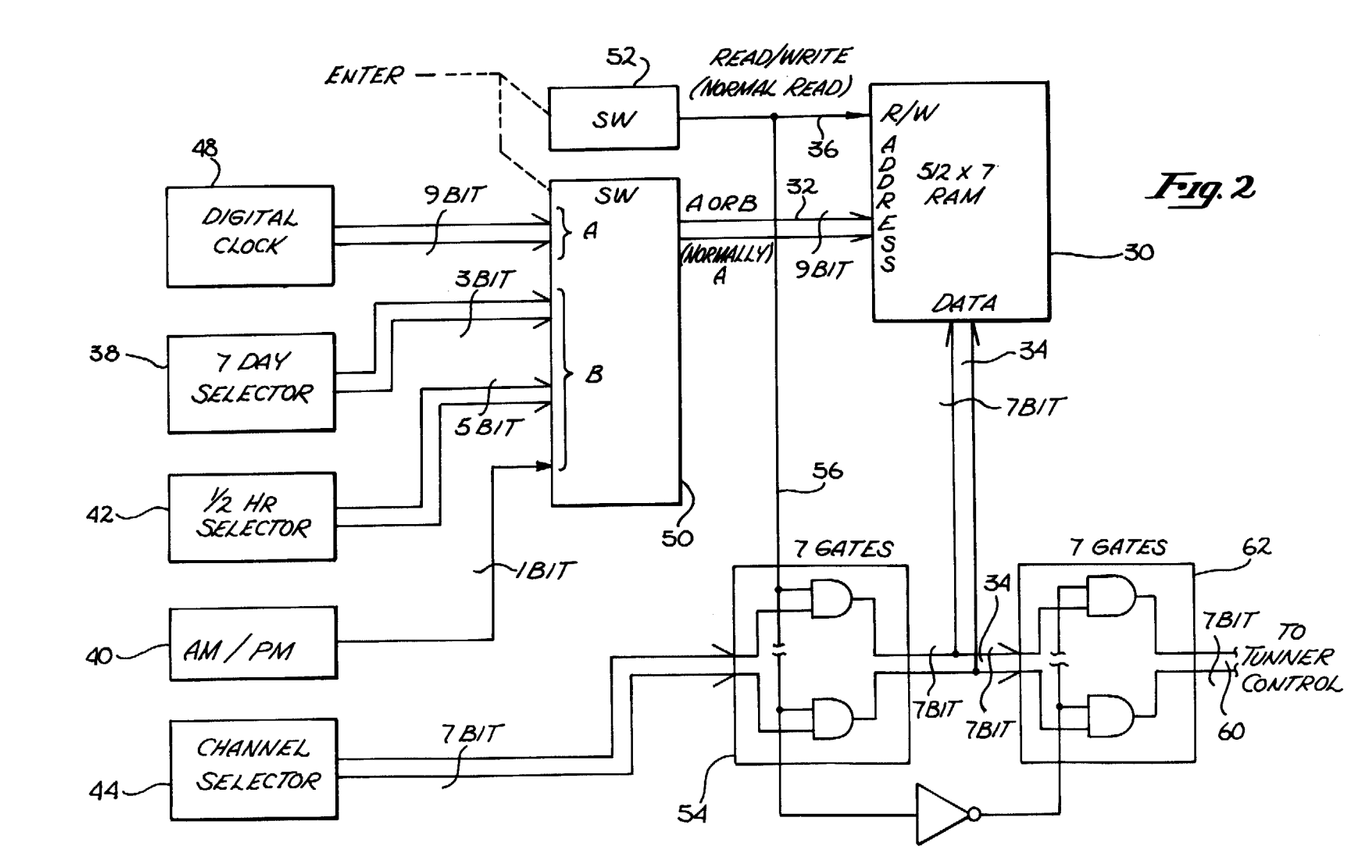
FIG. 2 is a block diagram of the first embodiment of the present invention.

Now referring to FIG. 2, a block diagram of the first embodiment of the present invention may be seen. This particular embodiment utilizes a random access memory means 30 having a 512 by 7 bit organization. Thus the memory, in addition to the usual power supply connections, etc., is characterized by nine address input lines 32 to receive a nine bit binary coded address, and seven input/output lines 34 for receiving input signals and/or providing an output signal in accordance with information previously stored in the memory. Also provided is a read-write control line 36, the state of which determines whether the memory 30 will read out information on the output lines 34 in accordance with the address provided on lines 32, or alternatively will enter into memory the information on the lines 34 in accordance with the memory location determined by the address provided on the lines 32.

Many different types of memory devices are suitable for use with the present invention. Of particular advantage however are semiconductor memory devices, as such devices are small, and require little power and minimum support circuitry. Both static and dynamic memories could be used, though static memories are preferred as to refresh cycle is required, and the slightly higher power consumption which may be characteristic of such memories is of little significance with 110 volt power available. (Suitable memory devices are available from Intel, Mountain View, Calif. and Texas Instruments and National Semiconductor, to name three of the well known manufacturers of such devices.) Also it should be noted that the organization of such memories is generally variable, and for that matter, it may be desired to vary from the organization provided herein for reasons which will be subsequently mentioned. In fact, other forms of alterable storage devices may be used, such as shift registers, provided they are implemented as random access memory means, that is, organized to allow storage access based upon clock and manually set inputs.

The memory 30 is generally utilized as a translator in the present invention, translating the input information provided on the address lines 32 representing a particular program interval, to output information on lines 34 determining the particular channel selection for that time interval dependent upon the previous programming of the memory. As such, the memory translates a time period to a channel selection in accordance with a previously selected choice for that time interval. The various choices are entered in the memory by the control panel 28 on the receiver shown in FIG. 1.

Figure 3:
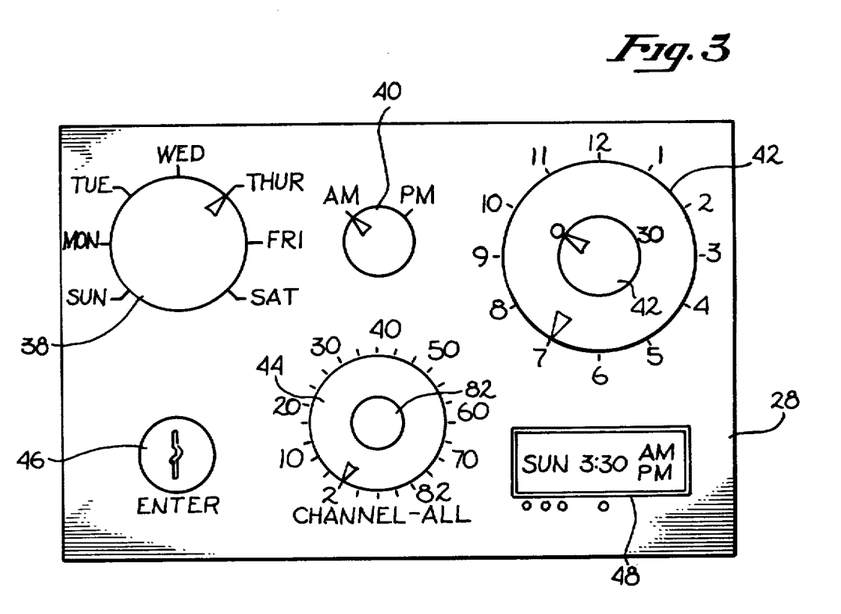
FIG. 3 is a front view shown in schematic form of the control panel of the first embodiment of present invention.

The control panel for programming the memory, the face of which is shown in detail in FIG. 3, is characterized by a first switch selector 38 for selecting the day of the week, a second switch selector 40 for selecting the morning or afternoon hours, a pair of switches 42 for selecting the hour and half-hour, and a channel selector switch 44 for selecting any of the eighty-two U.H.F. and V.H.F. channels. Entry of the selected information is made by a switch 46, which may be a key-operated switch to prevent subsequent alternation of the programmed information. Also presented on the face of the control panel is a clock 48 indicating the day of the week and time of the day, useful both as a convenience and for resetting a clock in the event power is interrupted. These various controls 38 through 48 are also shown in the block diagram of FIG. 2. The day of the week of seven-day selector 38 provides a three-bit binary coded signal providing a maximum of an eight day cycle if desired (a seven day cycle being the usual). The half hour selector 42 is a five bit signal, with the A.M./P.M. selector 40 providing and additional bit to designate between successive twelve hour periods. Thus, the half hour selector 42 covering the twenty-four half hour periods in each half day is more than adequately covered by the five bit signal. Finally, the channel selector 44 in this embodiment, also providing a binary coded signal, may have all the U.H.F. and V.H.F. channels, that is, all eighty-two channels, which are more than adequately covered by the seven bit signal. It is to be understood, however, that other forms of coding, or for that matter uncoded signals, may be used if desired. By way of example the channel selector 44 may be comprised of two side by side decimal switches, with the coding being binary coded decimal to give a possible range of selections from 00 to 99, again more than adequately covering the eighty-two channels available. (Some of these bits could be used to automate other functions if desired. By way of example 00 might be used for an automatic turn-off, 01 as automatic turn-on and/or 84 through 99 for such other functions as may be desired.) Binary coded decimal requires four bits for each digit, or a total of eight bits, and would therefore require a 512 by 8 memory organization.

It should also be noted that uncoded channel selections may also be used if desired. In particular, certain T.V. receivers may have push-botton or switching controls for a smaller number of channels selected from the eighty-two possible channels, the selections being determined in accordance with the reception where the set is to be used. In this case, the total number of selections available on any specific set may be sufficiently limited in number so that one bit may be assigned to each channel selection possible. Uncoding of the day and time of day is also a possibility, though most memories, particularly the semi-conductor memories commercially available at the present time at relatively low cost and in large quantities, include their own decoders, and uncoded time signals would probably require too many bits to be practical.

In the embodiment shown in FIG. 2, the digital clock 48 provides a nine bit binary coded time signal advancing each one half hour, with the seven day selector, the half-hour selector and the A.M./P.M. selector providing time selections of the same format and corresponding to the equivalent future output of the clock. A switching unit, shown schematically as block 50, selects between the current time signal determined by the day and time selectors, e.g., the nine bit signals (A) or the nine bit signals (B), and provides either of these signals to the memory 30 as the nine bit address input. Normally switch block 50 (an electronic or mechanical switch) will communicate the output of the digital clock to the memory address input, though upon mechanical or manual actuation of the enter switch 46, will change to communicate the future selected time to the address input. At the same time a switch 52 changes the signal on the read-write input 36 of the memory 30 from a read signal to a write signal, writing in the information then provided by the channel selector 44. In that regard it will be noted that the output of the channel selector 44 is coupled to an appropriate number of AND gates 54, with the gates being controlled by a signal on line 56 coupled to the read-write line. Thus only during the memory write operation is the output of the channel selector 44 coupled to the data input/output lines 34 of the memory. Further, the same signal on line 56 is coupled through an inverter 58 which decouples the information on lines 34 from the controller output on lines 60 used for the tuner controller by disabling AND gates 62. Thus during programming the various selections being programmed are decoupled from the tuner controller so as to not interfere with the current operation of the receiver (if then being used).

Having now described the general organization and inter-connection of the first embodiment of the present invention, an exemplary programming step will now be described. Assume one always wants to watch the 6:00 P.M. news every week day on channel five. In this case the seven day selector 38 is set to Monday, the half-hour selector 42 is set to 6:00, the A.M./P.M. selector is set to P.M. and the channel selector is set to channel five. On depression of the enter switch the output of the memory on lines 34 is decoupled from the controller output lines 60, the address for the particular half hour selected is provided to the memory, the output of the channel selector is coupled to the input/output lines 34 of the memory, and a write signal is directed to the memory to store the channel selection at the appropriate address. Obviously, to program for the remaining days of the week the seven day selector 38 is merely advanced through all the desired days, the enter switch 46 being actuated for each day that that particular program is desired.

Figure 4:
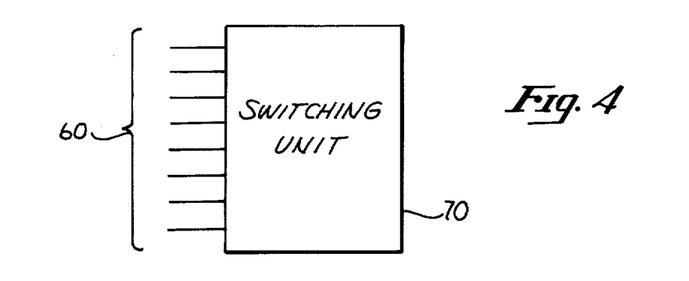
FIGS. 4, 5 and 6 are block diagrams illustrating various forms of implementation of the first embodiment of the present invention to prior art tuners.
Figure 5:
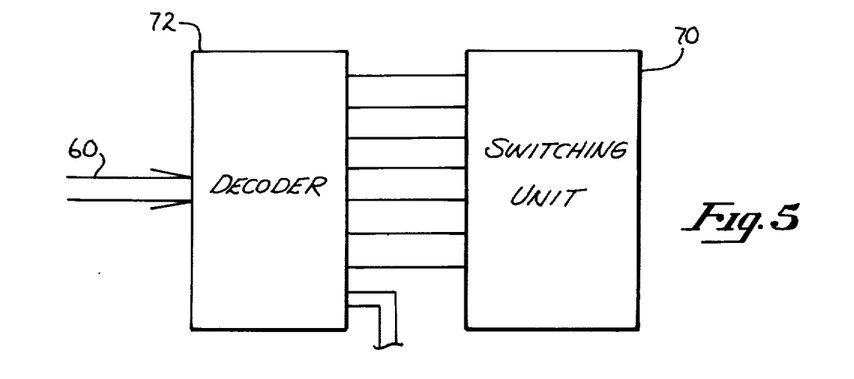
Figure 6:
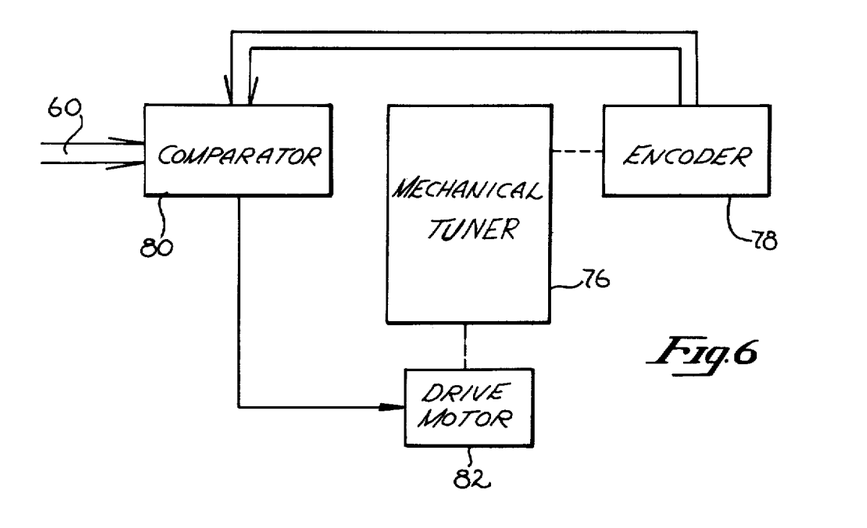

Now referring to FIGS. 4, 5 and 6, three exemplary forms of implementing the control signals on line 60 may be seen. In FIG. 4, illustrating the implementation for a system wherein the channel selection information is uncoded, a simple switching unit 70 to control a switch type selector may be used. Such switching units may be relays or semiconductor switches as desired. For systems utilizing coded channel information such as binary or binary coded decimal information, a decoder 72 is interposed between the lines 60 and the switching unit 70 to decode the selection, as shown in FIG. 5. It should be noted that if the number of possible channel selections is less than the number of combinations provided by the code, additional decoded outputs may be provided by the decoder 72, such as on lines 74 for such purposes as implementing the ON/OFF switch functions, etc. Finally in FIG. 6 an electromechanical system for operating a mechanical tuner 76 is shown. In this implementation the signals on lines 60, whether coded or uncoded, are compared with the output of an encoder 78 mechanically coupled to the mechanical tuner 76. A drive motor 82 coupled to the output of comparator 80 is used to advance the position of mechanical tuner until coincidence is obtained between the signal on line 60 and the signals provided by the encoder 78.

As a further example of the implementation of the present invention, reference is hereby made to a publication of the Zenith Radio Corporation of Chicago, Illinois entitled "Technician Participation Workshop, TPW 4" dated June 1976. This publication provides technical information with respect to certain tuners used on their television receivers. On page 62 thereof, a twelve position push-button manual varactor tuning system is shown, together with the logic diagram and circuit therefor. This tuner utilizes twelve push-buttons to cover the range of channels from two to thirteen, and twelve potentiometer adjustments for the tuning to up to twelve U.H.F. channels. Each potentiometer adjustment is associated with one of the twelve push-bottons so that the twelve V.H.F. or up to twelve U.H.F. channels may be selected through the equivalent of twenty-four switch closures. Accordingly for the direct implementation of the first embodiment of the present invention on a receiver using this tuning system, the switching unit 70 would provide the full range of tuner control possible for such receivers by providing these twenty-four switch closures automatically, either mechanically or electronically.

Figures 7, 8:
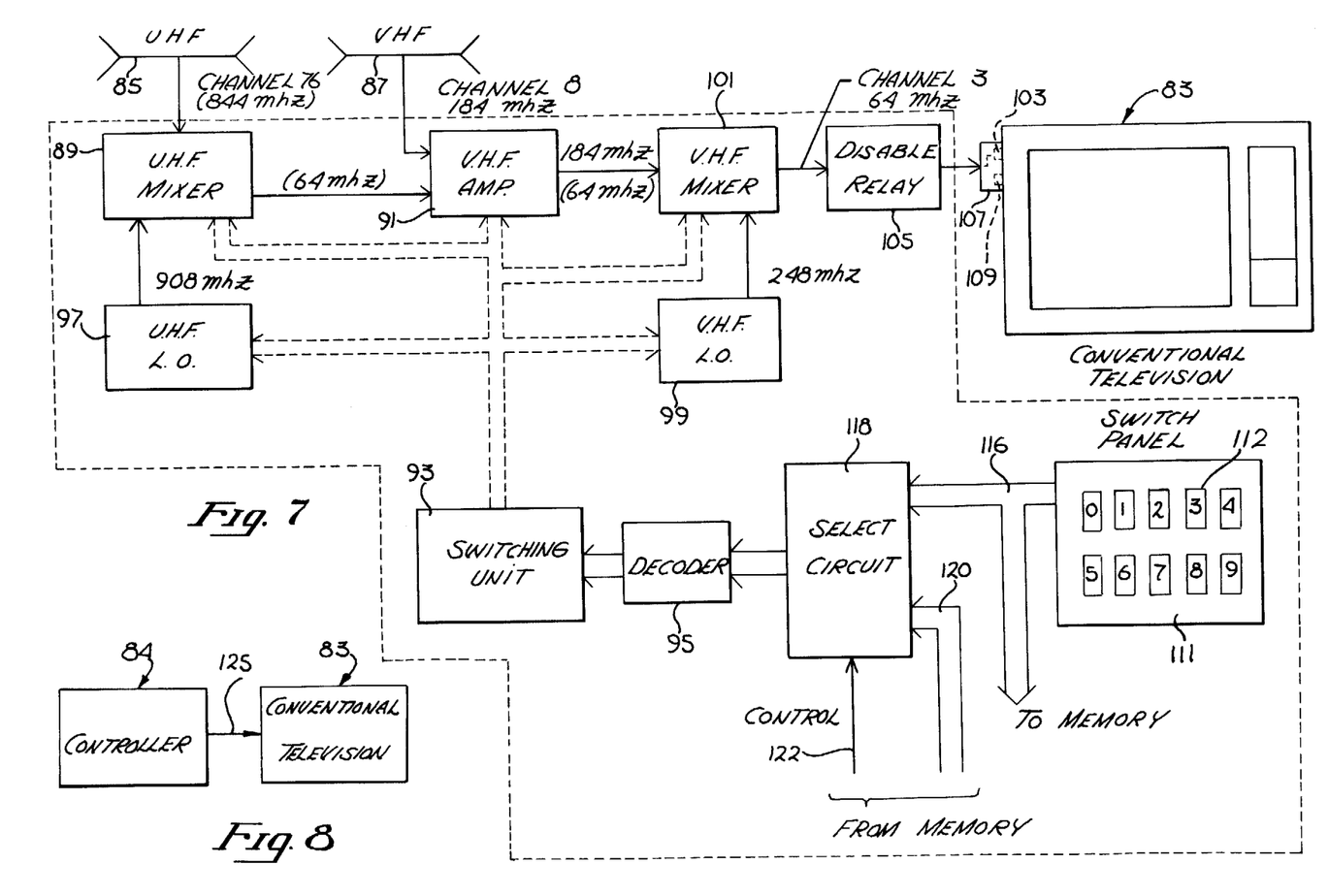
FIG. 7 and 8 are block diagrams of the second embodiment of the present invention.

A block diagram of a second embodiment of the present invention may be seen in FIG. 7. This embodiment differs from the first embodiment in that a conventional television receiver is converted to a programmable receiver by simply connecting the invention between the receiver antennas and the receiver's antenna terminals. In operation, the television receiver is set to a single channel such as channel three and the channel selection, either manual or automatic, is performed using a channel selector provided on the controller.

As shown in FIG. 7, a pretuner is used for converting the various U.H.F. and V.H.F. frequencies to a frequency corresponding to the V.H.F. channel selected on the receiver 83. For example, if channel three is selected, the converted frequency would be approximately 64 mHz.

The U.H.F. and V.H.F. antennas 85 and 86, which are normally connected to the receiver 83, are disconnected and reconnected to the inputs of a U.H.F. mixer 89 and a V.H.F. amplifier 91, respectively. The pretuner design is similar to ordinary television tuner and differs primarily only in frequency of operation. Preferably, the pretuner is of the non-motorized electronic tuner variety, utilizing varactor diodes in the U.H.F. and V.H.F. mixers 89 and 91, the U.H.F. and V.H.F. local oscillators 97 and 99 and the V.H.F. amplifier 91. By appropriately controlling the voltage applied to the varactors, the effective varactor capacitance can be changed thereby changing the pretuner frequency of operation. A switching unit 93 includes several digitally controlled electronic switches which vary the voltage applied to the various varactor diodes depending upon a digital input supplied by a decoder 95. The motorless electronic pretuner is similar to the tuners described in the Zenith Tuning System Manual published by the Zenith Radio Corporation in August of 1975, which was compiled to assist service technicians on servicing the tuning systems used in the Zenith Radio Corporation's "G" line of television receivers.

Operation of the pretuner can best be described by way of example. If, for example, V.H.F. channel eight is selected for viewing, the decoder 95 digital output will cause the electronic switches in switching unit 93 to apply voltages to the V.H.F. amplifier 91 so that the amplifier will be tuned to 184 mHz, the approximate channel 8 frequency of transmission. For V.H.F. operation, the switching unit 93 also disconnects the output of the U.H.F. mixer 89 from the input of the V.H.F. amplifier 91. The 184 mHz signal, supplied by V.H.F. antenna 87, is amplified by amplifier 91 and then mixed with the output of the V.H.F. local oscillator 99 by V.H.F. mixer 101. For channel eight reception, switching unit 93 will force the local oscillator 99 output frequency to 248 mHz so that the V.H.F. mixer 101 output, which is the difference between the two inputs, will be 64 mHz. The 64 mHz signal, which corresponds to the channel three transmission frequency, is connected to the V.H.F. antenna terminal 103 through a disable relay 105. The purpose of the relay will be discussed below. It can be seen that if the television receiver 83 is set for channel three, channel eight will be received. The output of the V.H.F. mixer 101 is provided with a bandpass filter, not shown, having a 64 mHz center frequency and a bandwidth of approximately 5mHz to insure that no signals other than the signal corresponding to channel three is present at the V.H.F. terminal 103. If other channels are selected using the television 83 channel selector, obviously, nothing will be received. A metal box or bracket 107 is attached to the receiver 83 which covers both the V.H.F. and U.H.F. antenna terminals 103 and 109 so that the controller cannot be defeated by disconnecting the controller output and attaching conventional antennas to the terminals.

For U.H.F. operation, switching unit 93 connects the U.H.F. mixer 89 output to V.H.F. amplifier 91, disconnects the V.H.F. antenna 87 and disables V.H.F. local oscillator 99. If U.H.F. channel seventy-six reception is desired, for example, switching unit 93 will force the U.H.F. local oscillator 97 output frequency to approximately 908 mHz. The local oscillator 97 output is mixed by U.H.F. mixer 89 with the 844 mHz channel seventy-six signal provided by U.H.F. antenna 85. The mixer 89 64 mHz output, the frequency of which is the difference between the channel seventy-six and the U.H.F. local oscillator 97 output frequencies, is fed to the V.H.F. amplifier 91. The signal is amplified and fed through V.H.F. mixer 101 and the disable relay 105 to the V.H.F. antenna terminal 103. The V.H.F. mixer 101 has no effect on the 64 mhz signal other than slightly reducing the signal's strength since V.H.F. local oscillator 99 is disabled. The frequency of the signal is the same as the U.H.F. channel three transmission frequency, therefore, by setting the television receiver 83 for channel three reception, U.H.F. channel 76 will be received. The bandpass filter at the output of V.H.F. mixer 101 prevents the reception of signals other than the 64 mHz signal.

FIG. 8 shows a modified view of the second embodiment wherein the controller 84 output 125 is connected to the input of the conventional television 83 intermediate frequency (I.F.) amplifier stage rather than the V.H.F. antenna input 103. In this variation, the U.H.F. and V.H.F. mixers 89 and 91, and the U.H.F. and V.H.F. local oscilators 97 and 99 are designed so that the pretuner 84 output is approximately 44 mHz, which is the center frequency of operation of television receiver I.F. amplifiers. If, for example, channel eight is being received, switching unit 93 will force the V.H.F. amplifier 91 to be tuned to a center frequency of approximately 184 mHz corresponding to the channel eight frequency of transmission. Switching unit 93 will also force the V.H.F. local oscillator to 228 mHz so that the V.H.F. mixer 101 output frequency will be the difference or 44 mHz. The 44 mHz signal is then coupled through the disable relay 105 to the television 83 I.F. amplifier stage input.

Installation of the modified second embodiment is accomplished by removing an interconnect cable connecting the television 83 tuner to the I.F. amplifier and then connecting the controller output 125 to the television I.F. amplifier input. In most cases the interconnect cable is provided with quick-release electrical connectors as is the controller output 125 cable, consequently installation is quite simple. Because the television 83 tuner has been bypassed, channel selection is controlled solely by switch panel 111. The modified second embodiment controller 84 pretuner frequency of operation is identical to that of a conventional television tuner consequently the design is advantageous in that many of the components of a conventional tuner can be utilized in construction of the controller.

The second embodiment programmer is provided with a control panel similar to the first embodiment panel shown on FIG. 3. However, the channel selection 44 is replaced with a push-button panel 111 which can be seen in FIG. 7. The panel 111 has ten push-button switches numbered zero through nine. Any channel, including the twelve V.H.F. channels and the seventy U.H.F. channels, may be selected by simply depressing one or more of the appropriate push-buttons. For example, if V.H.F. channel six is desired, the push-button marked "6" would be depressed and, similarly, U.H.F. channel thirty-eight would be selected by depressing push-buttons labeled "3" and "8". Switch panel 111 further includes an encoding means for converting the push-button depressions to a binary coded output 116.

An alternative switch panel (not shown) having thirteen push-buttons could also be used. One of the push-buttons is a V.H.F./U.H.F. select. When this push-button is not depressed, any one of the twelve U.H.F. channels may be selected by depressing any one of the twelve remaining push buttons. When the V.H.F./U.H.F. select push-button is depressed, the remaining twelve push-buttons then control the reception of U.H.F. channels. Means are provided for initially selecting a group of twelve U.H.F. channels which are most frequently viewed. Any one of the group of twelve U.H.F. channels may then be selected by depressing one of the twelve push-buttons. Again, an encoding means is provided for converting the push-button switch outputs to a binary code.

The second embodiment programmer is programmed in the same manner as the first embodiment. The day and time that the program will be viewed is selected by means of the seven-day selector 38, the A.M./P.M. selector 40 and the half-hour selector 42. The appropriate channel select button 112 is depressed and then the lockable enter switch 46 is activated. The activation of the enter switch 46 causes the coded output 116 of the switch panel 111 to be loaded into a semiconductor memory, the number of bits in the coded output being determined by the binary code being used. Since there are eighty-two possible combinations (twelve V.H.F. and seventy U.H.F. channels), there must be at least seven binary bits. A control bit, which will be discussed below, is also loaded into memory making the minimum word length eight bits. The memory addressing is accomplished in the same manner as in the first embodiment. As can be seen in FIG. 2, there are two sources of memory addresses 32. The digital clock 48 has nine bit output address A used for memory reading. The nine output bits of seven-day selector 38, one-half hour selector 42 and A.M./P.M. selector 40 form address B which is used for memory writing. The address source is selected by the switching unit 50 which normally selects memory-read address A. When enter switch 46 is activated, memory-read address B is selected by switching unit 50 so that the coded switch panel outputs 116 shown in FIG. 7 are loaded into the memory at an address corresponding to the time the desired program will be broadcast.

The switching unit 93, which selects the channel to be viewed, is controlled by one of two sources. If the time period is one which has been programmed, the data contained in the memory is used. If the time period is open, switching unit 93 is controlled by the output 116 of switch panel 111 which, of course, would permit any channel to be selected. A digital select circuit 118 selects the source to be used, depending upon the status of a digital control input 122. As discussed above, when a time period is programmed, one of the bits of the word loaded into memory is a control bit. When a particular memory address is generated, the control bit will be a "one" if the address or time period has been programmed and a "zero" if the period is open. The presence of the bit will cause the control line 122 to be high or a logic "one" thereby causing the select circuit 118 to select the memory output 120 as a program source. Conversely, if the period has not been programmed, the bit will be a "zero" and the switch panel 111 output 116 will be selected thereby permitting the viewing of any channel.

Unless a non-volatile memory is used, loss of power in the programmable controller will cause the loss of the programmed data. In order to avoid defeating the controller by simply disconnecting the power source and reconnecting it thereby destroying or altering the program, a disable relay 105 is used. This latching relay will automatically disconnect the output of the programmer from the television receiver V.H.F. antenna terminal 103 upon loss of programmer power so that reception of all channels is prevented. The disable relay 105 must be manually reset by activation of the lockable enter switch 46 in order to restore reception. Enter switch 46 has separate contacts for this purpose which are connected to the reset coil terminals of the disable relay 105, and a power souce so that the reset coil is energized and the relay resets everytime the switch is activated.

A rechargeable sustaining battery may be used instead of the disable relay 105. The sustaining battery is normally being charged by the same A.C. power source powering the programmer. When programmer power is lost the programmer power input is automatically switched from the A.C. source to the battery thereby preventing loss of the memory program. The programmer draws relatively little power, so that the battery is capable of powering the programmer for several hours.

Obviously other embodiments of the present invention may readily be implemented. Thus while two embodiments of the present invention have been disclosed and described in detail herein, it will be understood by those skilled in the art that various changes in form the detail may be made therein without departing from the spirit and scope of the invention.

I claim:

1. A programmable television controller comprising:
   a random-access memory means for storing data;
   storing means for storing data corresponding to channel selections in said memory means at write-addresses corresponding to future time periods, with said storing means including a write-address for application to said memory means means for generating said write-addresses;
   read means for reading out said data from said memory means by application of real time related read-addresses thereto when real time coincides with said future time periods and
   control means for controlling the reception of a television receiver according to said data read from said memory means.

2. The controller of claim 1 wherein said memory means is a semiconductor memory.

3. The controller of claim 1 wherein said storing means includes a means for generating said write-addresses which is responsive to the position of at least one first switch and a means for generating said data corresponding to channel selections which is responsive to the position of at least one second switch.

4. The controller of claim 1 wherein said controller means controls the reception of said television receiver by limiting the reception to a channel corresponding to said data read from said memory means if said data is present.

5. A programmable television controller comprising:
   random-access memory means for storing data;
   data means for selectively generating data corresponding to a television channel;

write-address means selectively generating a write-address corresponding to a future time for application to said memory means;

program means for selectively storing said data in said memory means at said write-address;

read-address means for generating said read-addresses responsive to real time;

memory read means for applying said read-addresses to said memory means for reading out said data stored in said memory means; and control means for controlling the reception of a television receiver according to said data read from said memory means.

6. The controller of claim 5 wherein said memory means is a semiconductor memory.

7. The controller of claim 5 wherein said data means comprises at least one switch.

8. The controller of claim 5 wherein said write-address means comprises at least one switch.

9. The controller of claim 5 wherein said program means comprises:

means for normally coupling said read-address means to said memory;

means for normally placing said memory in a read mode;

switching means for momentarily decoupling the read-address means from said memory means, coupling said write-address means to said memory means, and switching said memory means from said read mode to a write mode.

10. The controller of claim 5 wherein said read-addresses are binary coded signals which increment on one-half hour intervals.

11. The controller of claim 5 wherein said control means controls said reception of said television receiver by limiting the reception to a channel corresponding to said data read from said memory means if said data is present.

12. The controller of claim 5 wherein said control means controls the reception of said television receiver by limiting the reception to a channel other than the channel corresponding to said data received from said memory means if said data is present.

13. The controller of claim 5 wherein said control means includes a pretuner means having at least one input for coupling to a television receiver antenna and a pretuner output for coupling to an input on a television receiver, said pretuner means being a means for selectively converting any one of a plurality of multi-frequency television signals present at said pretuner input to a fixed frequency signal.

14. The controller of claim 13 wherein said control means further includes a disable means for disabling said control means thereby preventing reception of any channel when a power source powering said controller is interrupted, said disable means continuing to disable said controller until said disable means is reset.

15. The controller of claim 13 wherein said controller is installed within a controller housing, said controller housing being located outside a television receiver housing which encloses the television receiver controlled by said controller.

16. The controller of claim 13 wherein said pretuner output is for coupling to an antenna input on the television receiver and the frequency of said fixed frequency signal corresponds to a predetermined television signal.

17. The controller of claim 13 wherein said pretuner output is for coupling to an input of an intermediate frequency amplifier stage in the television receiver and the frequency of said fixed frequency signal corresponds to the intermediate frequency amplifier stage frequency of operation.

18. A programmable television controller comprising:

a random-access memory means for storing data;

storing means for storing data corresponding to channel selections in said memory means at write-addresses corresponding to future time periods, with said storing means including a write-address means for generating said write-addresses for application to said memory means;

read means for reading out said data from said memory means by application of real time related read-addresses thereto when real time coincides with said future time periods and, control means for controlling the reception of a television receiver according to said data read from said memory means, said control means including a pretuner means having at least one input for coupling to a television receiver antenna and pretuner output for coupling to an input on the television receiver, said pretuner means being a means for selectively converting any one of a plurality of multi-frequency television signals present at said pretuner input to a fixed frequency signal;

a controller housing for housing said controller, said controller housing being located outside a television receiver housing which encloses the television receiver controlled by said controller.

* * * * *